United States Patent [19]

Sezi et al.

[11] Patent Number: 5,760,162
[45] Date of Patent: Jun. 2, 1998

[54] PREPARATION OF POLY-O-HYDROXYAMIDES AND POLY-O-MERCAPTOAMIDES

[75] Inventors: Recai Sezi; Hellmut Ahne, both of Roettenbach; Roland Gestigkeit, Nuremberg; Kurt Geibel, Hessdorf, all of Germany

[73] Assignee: Siemens Aktiengesellschaft, München, Germany

[21] Appl. No.: 703,754

[22] Filed: Aug. 27, 1996

[30] Foreign Application Priority Data

Aug. 31, 1995 [DE] Germany ............ 195 32 175.8

[51] Int. Cl.$^6$ .................. C08G 69/08; C08G 73/10
[52] U.S. Cl. .................. 528/310; 528/183; 528/185; 528/99; 528/109; 528/112; 528/115; 528/120; 528/171; 528/173; 528/288; 528/293; 528/335; 528/357; 528/481; 528/513; 521/180; 521/182; 521/184
[58] Field of Search .................. 528/183, 185, 528/99, 109, 112, 115, 120, 171, 173, 288, 293, 335, 357, 481, 503, 310, 513; 521/180, 182, 184

[56] References Cited

U.S. PATENT DOCUMENTS

| | | | |
|---|---|---|---|
| 3,637,601 | 1/1972 | Truce | 260/78 R |
| 4,331,592 | 5/1982 | Wissmann et al. | 260/112.5 R |
| 4,339,521 | 7/1982 | Ahne et al. | 430/192 |
| 4,622,285 | 11/1986 | Ahne | 430/322 |
| 4,849,051 | 7/1989 | Ahne et al. | 156/659.1 |
| 5,021,320 | 6/1991 | Mueller et al. | 430/192 |
| 5,037,720 | 8/1991 | Khanna | 430/190 |
| 5,096,999 | 3/1992 | Hellmut et al. | 528/182 |
| 5,114,826 | 5/1992 | Kwong et al. | |
| 5,194,568 | 3/1993 | Gregory et al. | 528/184 |
| 5,219,981 | 6/1993 | Gregory et al. | 528/377 |
| 5,322,916 | 6/1994 | O'Brien et al. | |

FOREIGN PATENT DOCUMENTS

| | | |
|---|---|---|
| 0 023 662 | 2/1981 | European Pat. Off. |
| 0 158 726 | 10/1985 | European Pat. Off. |
| 0 264 678 | 4/1988 | European Pat. Off. |
| 0 291 779 | 11/1988 | European Pat. Off. |
| 0 391 196 | 10/1990 | European Pat. Off. |
| 0 436 457 | 7/1991 | European Pat. Off. |
| 0 481 402 | 4/1992 | European Pat. Off. |
| 37 16 629 | 12/1988 | Germany |

OTHER PUBLICATIONS

Chem Abstract "Polyamine, Polyamine Formesl, Polysulfane, Polysulfane Formesl" 189289-51-8 Registry 1997.

Labadie, J. et al., "Recent Advances in High Temperature Polymers For Microelectronic Applications," *SAMPE Journal*, vol. 25, No. 6, Nov./Dec. 1989, pp. 18–23.

Proceedings of the 1992 International Conference on Multichip Modules, Apr. 1–3, 1992 Radisson Hotel Denver, pp. 394–400.

Soane, D. et al., "Resists in Microlithography," *Polymers in Microelectronics Fundamentals and Applications*, (1989), pp. 77–124.

Mercer, F., "Aromatic Poly(ether imide oxadiazole)s," *High Performance Polymers*, vol. 4, No. 2 (1992), pp. 73–80.

Ahne, H. et al., "Recent Advances in Photosensitive Polyimides," *Polymers for Advanced Technologies*, vol. 4 (1993), pp. 217–233.

*Primary Examiner*—Duc Truong
*Attorney, Agent, or Firm*—Kenyon & Kenyon

[57] ABSTRACT

In a process for the preparation of poly-o-hydroxyamides and poly-o-mercaptoamides, a bis-o-aminophenol or a bis-o-aminothiophenol is reacted at a temperature of $\leq 0°$ C. with a mixed dianhydride of a dicarboxylic acid and a sulfonic acid with the following structure:

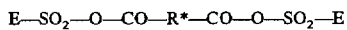

$$E-SO_2-O-CO-R^*-CO-O-SO_2-E$$

where E is an (optionally substituted) methyl, phenyl, or naphthyl group and $R^*$ is the parent body of the dicarboxylic acid.

6 Claims, No Drawings

PREPARATION OF POLY-O-HYDROXYAMIDES AND POLY-O-MERCAPTOAMIDES

FIELD OF THE INVENTION

The invention relates to a process for the preparation of poly-o-hydroxyamides (polybenzoxazole precursors) and poly-o-mercaptoamides (polybenzothiazole precursors).

BACKGROUND OF THE INVENTION

Highly thermoresistant polymers are required in microelectronics, particularly as protective and insulating coatings and as dielectrics (see, for example, "SAMPE Journal" 25, No. 6, pp. 18–23 (1989) and "Proceedings of the 1992 International Conference on Multichip Modules", pp. 394–400). Some of the polymers used, such as homo- and copolymers of aromatic polyethers and precursors of polyimides (PI) and polybenzoxazoles (PBO) have good solubility in organic solvents and good film-forming properties and can be applied to electronic components by means of spin-coating technology (see, for example, "High Performance Polymers" 4, No. 2, pp. 73–80 (1992) and "Polymers for Advanced Technologies" 4, pp. 217-233 (1993)).

Polymer precursors of the above-mentioned type are cyclized, i.e., converted to the corresponding polymers (PI or PBO), by means of a temperature treatment; this results in the final properties. As a result of the cyclization, the hydrophilic groups of the poly-o-hydroxyamide disappear, i.e., the NH, OH, and CO groups, which groups otherwise would have a negative effect on the dielectric properties and the water absorption. This is, for example, a significant advantage of the polybenzoxazoles as compared with the polyimides (which have two CO groups per imide unit) and, in particular, as compared with the hydroxypolyimides (which have two CO groups and one OH group per imide unit). In addition, cyclization is important not only for producing good dielectric properties and low water absorption of the end product, but also for producing high temperature stability.

PI and PBO precursors can, for example, be adjusted photosensitively by the addition of suitable photoactive components and can then be structured directly, i.e., without the use of an auxiliary resist. This is important for the reason that direct structuring—as compared with indirect structuring—offers considerable cost advantages.

In contrast to most photosensitive PI precursors, photosensitive PBO precursors offer the advantages of a positive structurability, such as a lower defect density in the structuring of the so-called via holes", because—in comparison with negative operating systems—only a fraction of the surface is exposed to light. The use of alkali-soluble PBO precursors also results in the possibility of an aqueous alkaline development. After photostructuring, cyclization of the precursors is then carried out by annealing.

PBO precursors that can be developed in aqueous alkaline medium are already known (see European Patent 0 023 662, European Application 0 264 678, and European. Patent 0 291 779). The photolithographic process used, except for the cyclization step, is the same as in the structuring of known positive resists based on novolaks and quinone azides, a process that is used in numerous production lines worldwide (see, for example, D.S. Soane and Z. Martynenko: "Polymers in Microelectronics—Fundamentals and Applications", Elsevier, Amsterdam (1989), pp. 77–124).

The solubility of the PBO precursors in alkalies is an important requirement for their use as base polymers for photosensitive dielectrics that can be developed in aqueous alkalies. For microelectronic uses, the precursors must be soluble in developers free of metal ions, so that developers of this type can also be used in the photostructuring. This is because developers containing metal ions can have a negative effect on the electrical operation of the components.

The most common method for the preparation of alkali-soluble PBO precursors, i.e., of poly-o-hydroxyamides, is the reaction of a dicarboxylic acid chloride with a suitable bis-o-aminophenol. To capture the hydrogen chloride formed in the reaction, a soluble base, such as pyridine, is added, as a rule (see European Application 0 264 678 and European Patent 0 291 779). Although it is possible, by means of this method, to prepare precursors that are soluble in aqueous alkaline developers free of metal ions, there is the disadvantage that chloride ions remain in the polymer. However, a polymer of this type can not be used as a coating material for microelectronic components, because the chloride ions cause corrosion and can thus strongly impair the operation of the components. A purification of the polymer by means of ion exchangers is therefore required. However, this purification is time-consuming and expensive, as it includes additional process stages, such as the preparation of the ion-exchange column, dissolution of the polymer, passage of the solution through the column and rewashing, and repetition of the precipitation and drying.

In the preparation of poly-o-hydroxyamides, it is also necessary to meet the requirement that the dicarboxylic acid chloride react predominantly with the amino groups of the bis-o-aminophenol (with amide formation), but not with its hydroxyl groups (with ester formation), i.e., the reaction selectivity of the amide formation must be high as compared with that of the ester formation. If the ester formation cannot be excluded or strongly suppressed, then this will lead to insufficiently alkali-soluble polymers. A low reaction selectivity can also lead to a gel formation in the polymer solution, as a result of which the poly-o-hydroxyamide produced then becomes unfilterable and thus useless.

Processes for the chloride-free synthesis of poly-o-hydroxyamides—and also of poly-o-mercaptoamides—have also been described. Thus, it is known, from European Application 0 158 726, to react dihydroxy- and dimercaptodiamino compounds with a dicarboxylic acid in the presence of a carbodiimide. However, in this reaction, urea residues remaining on the resin as a result of a rearrangement reaction frequently present problems. This is because they reduce the thermal stability of the polybenzoxazole or polybenzothiazole and the quality of the coatings prepared from these. In addition, the polymers produced by this process are not sufficiently soluble in aqueous alkaline developers free of metal ions.

An alternative chloride-free production process for poly-o-hydroxyamides consists of using condensation reagents, such as 1-ethoxycarbonyl-2-ethoxy-1,2-dihydroquinoline and 1,1'-carbonyldioxydi-1,2,3-benzotriazole (see European Application 0 391 196) for the reaction of the dicarboxylic acid with the bis-o-aminophenol. However, the polymers produced in this manner also show an insufficient solubility in aqueous alkaline developers free of metal ions.

Processes are also known in which the amide formation takes place by means of phosphorus compounds (see: European Application 0 481 402, U.S. Pat. No. 4,331,592, and German Application 3,716,629). However, in the case of poly-o-hydroxyamides, syntheses of this type lead either to cyclized, i.e., alkali-insoluble, products, or phosphorus-containing, in part also chemically bonded, residues remain in the polymer and cause the polymer to be unusable for microelectronic applications because of the doping properties of phosphorus. This is because, in contrast to ionic impurities, residues of this type cannot be removed, e.g., by means of ion exchangers.

SUMMARY OF THE INVENTION

It is the object of the invention to provide an economical process by which poly-o-hydroxyamides and poly-o-mercaptoamides that are soluble in aqueous alkaline developers free of metal ions can be prepared in a chloride-free manner.

According to the invention, this is achieved by reacting a bis-o-aminophenol or a bis-o-aminothiophenol at a temperature of $\leq 0°$ C. with a mixed dianhydride of a dicarboxylic acid and a sulfonic acid with the following structure:

where E is an (optionaly substituted) methyl, phenyl, or naphthyl group and R* is the parent body of the dicarboxylic acid.

DETAILED DESCRIPTION OF THE INVENTION

The present invention is directed to methods for producing poly-o-hydroxyamides and poly-o-mercaptoamides.

According to the invention, such compounds are produced by reacting a bis-o-aminophenol or a bis-o-aminothiophenol at a temperature of $\leq 0°$ C. with a mixed dianhydride of a dicarboxylic acid and a sulfonic acid with the following structure:

where

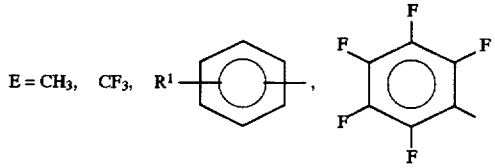

with $R^1$=H, F, CH$_3$, or CF$_3$;

R* has the following meaning:

$(CR_2)_m$, with R=H, F, CH$_3$, or CF$_3$ and m=1 to 10;

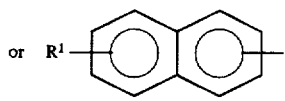

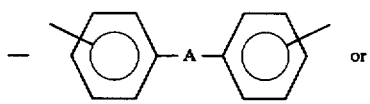

with A=$(CH_2)_n$, $(CF_2)_p$, $C(CH_3)_2$, $C(CF_3)_2$, $C(CH_3)(C_6H5)$, $C(CF_3)(C_6H_5)$, $C(CF_3)(C_6F_5)$, $C(C_6H_5)_2$, $CF_2$—$CF(CF_3)$, CH=CH, CF=CF, C≡C, O—$C_6H_4$—O, O, S, CO, or SO$_2$, where n=0 to 10 and p=1 to 10;

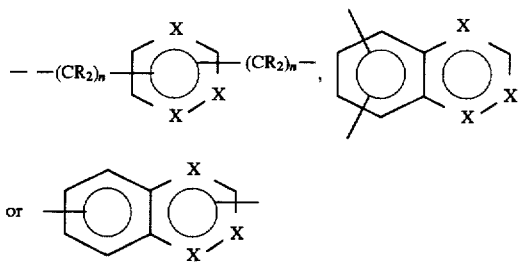

with X=CH or N.
R=H, F, CH$_3$, or CF$_3$ and n=0 to 10;

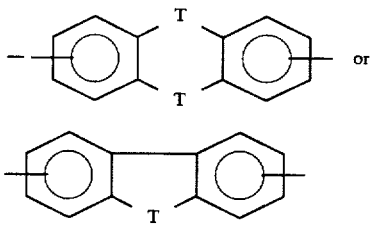

with T=CH$_2$, CF$_2$, CO, O, S, NH, or N(CH$_3$);

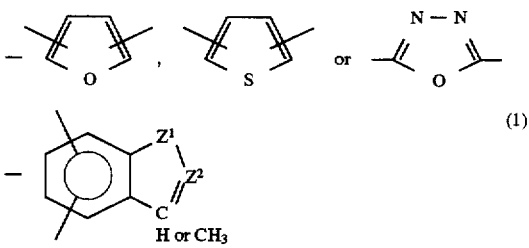

(1)

with (a) $Z^1$=CH$_2$ or CH (CH$_3$) and $Z^2$=CH or C (CH$_3$) (b) $Z^1$=CH$_2$ or CH (CH$_3$) and $Z^2$=N (c) $Z^1$=NH or N (CH$_3$) and $Z^2$=CH or C (CH$_3$) (d) $Z^1$=NH or N (CH$_3$) and $Z^2$=N

(2)

with (a) $Z^3$=CH or C (CH$_3$) (b) $Z^3$=N

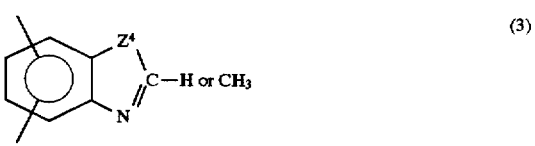

(3)

with (a) $Z^4$=O (b) $Z^4$=S;
where, in each case, all hydrogen atoms (H) in all aromatic partial structures can be replaced by fluorine (F).

The invention solves the problem described above by using, as the dicarboxylic acid component, special mixed dianhydrides, namely mixed dianhydrides of a dicarboxylic acid and a sulfonic acid. Surprisingly, this results in an adequate selectivity of the amide formation. This is because the polymers prepared according to the invention, i.e., the poly-o-hydroxyamides and poly-o-mercaptoamides, are soluble in aqueous alkaline developers free of metal ions. In addition, the process according to the invention takes place without gel formation, so that the above-mentioned polymers are readily soluble and processable in organic solvents. Also, impurities such as chloride and metal ions and phosphorus compounds are avoided in this process.

Special mixed dianhydrides of dicarboxylic acids and sulfonic acids, particularly a toluenesulfonic acid, preferably D-toluenesulfonic acid are used for the synthesis of the polymers. However, other sulfonic acids, such as methane- and trifluoromethanesulfonic acids, benzenesulfonic acids, perfluorobenzenesulfonic acid, and naphthalenesulfonic acids can also be used.

Mixed dianhydrides with dicarboxylic acids, such as 1,3-benzenedicarboxylic acid (isophthalic acid) and diphenylether-4,4'-dicarboxylic acid (oxydibenzoic acid) are preferably used for the synthesis of the precursors. However, in general, those dicarboxylic acids that are used for the preparation of precursors of the abovementioned type can be used.

Particularly suitable bis-o-aminophenols are 2,2-bis(3-amino-4-hydroxyphenyl)hexafluoropropane and 3,3'-dihydroxy-4,4'-diaminodiphenyl. The corresponding bis-o-aminothiophenols are used for the synthesis of poly-o-mercaptoamides. In principle, however, all bis-o-aminophenols and -thiophenols that are customarily used for the preparation of polybenzoxazole and polybenzothiazole precursors can be used.

The reaction of the dianhydride with the bis(thio)phenol takes place advantageously in the presence of a basic catalyst, which is preferably a tertiary amine. Catalysts of this type are, in particular, pyridine, triethylamine, diazabicyclooctane, and polyvinylpyridine. However, other basic catalysts can also be used, in which case preference is given to those that are readily soluble in the solvent used in the synthesis of the precursor, such as N-methylpyrrolidone, or are readily soluble in water or water/alcohol mixtures (precipitants), or those that are completely insoluble, such as cross-linked polyvinylpyridine. It has proved advantageous to use at least a fourfold quantity (in mols)—based on the dianhydride—of the basic catalyst.

The reaction temperature in the reaction between the dianhydride and the (thio)phenol is $\leq 0°$ C. It has proved advantageous for the reaction selectivity if the reaction temperature is $\leq -5°$ C.

The process according to the invention is therefore carried out advantageously by dissolving the bis-o-aminophenol or -thiophenol and a basic catalyst at room temperature in an organic solvent and cooling the solution to approximately $-10°$ C. A solution of the dianhydride in an organic solvent is then added to this solution in such a manner that the temperature does not rise above $-5°$ C. After the addition is complete, the reaction solution is kept for at least three hours at a temperature of 20° to 25° C. and the reaction product is then precipitated with a suitable precipitant. After filtration and drying, the precipitated polymer is ready for use. The process according to the invention thus eliminates cumbersome purification steps, such as the purification of the polymer by means of ion exchangers.

N-Methylpyrrolidone, tetrahydrofuran, and N,N-dimethylacetamide are suitable solvents. In principle, however, one can use any solvent in which the starting components are readily soluble. Particularly suitable precipitants are water and mixtures of water with alcohols, such as ethanol and isopropanol.

In the process according to the invention—in the presence of an excess of bis-o-aminophenol or -thiophenol—the amino end groups of the poly-o-hydroxyamide or—mercaptoamide produced can be capped, i.e., blocked, with a dicarboxylic acid anhydride before precipitation of the polymer. Cis-5-norbornene-endo-2,3-dicarboxylic acid anhydride is particularly suitable for this purpose.

From U.S. Pat. No. 3,637,601, it is known to prepare sulfur-containing polyesters and polyamides by the reaction of a mixed dianhydride of a dicarboxylic acid and a sulfonic acid with a glycol and/or a diamine in the presence of a base. The reaction takes place at 10° to 150° C., and polymers with a sulfur content of 0.01 to 8 weight are obtained. However, polymers of this type, with sulfur in the polymer chain, are unsuitable for uses in microelectronics, because, on the one hand, they can cause corrosion, and, on the other hand, in reducing media, such as occur in semiconductor production, they can lead to contact coatings and then reduce the reliability of electrical contacts. It is also found that the known process is unsuitable for the preparation of alkali-soluble precursors, because no adequate selectivity of amide formation is obtained (see Example 2 below.)

The invention is explained in greater detail by means of the following examples.

Example 1

For the preparation of a PBO precursor, the following procedure is followed: 4.64 g of 2,2-bis(3-amino-4-hydroxyphenyl)hexafluoropropane (12.7 mmol) is dissolved with stirring in 50 ml of tetrahydrofuran and 4.01 g of pyridine (50.7 mmol) is then added. The solution obtained is cooled to $-10°$ C. and a solution of 4.81 g of a dianhydride of isophthalic acid and p-toluenesulfonic acid (10.1 mmol) in 150 ml of tetrahydrofuran is added dropwise, with stirring, in such a way that the temperature of the reaction solution does not exceed $-50°$ C. After the addition is complete, the reaction solution is stirred for another 4 hours at a temperature of 20° to 250° C.

The end groups are then blocked by the dropwise addition of a solution of 0.83 g of cis-5-norbornene-endo-2,3-dicarboxylic acid anhydride in 15 ml of tetrahydrofuran at 10° C. within 15 minutes, followed by stirring for 20 hours at 20° to 25° C. The reaction solution obtained is filtered off and the poly-o-hydroxyamide formed is precipitated with 1600 ml of a mixture of isopropanol and water (volume ratio 1:3). The precipitate is filtered off, washed twice with 400-ml portions of water, and dried in a vacuum oven for 72 hours at 50° C. The capping of the end groups has no effect on the polymerization and is carried out only in order, in particular, to improve the thermal dimensional stability of the polymer during the cyclization by means of cross-linking; the capping can therefore also be omitted.

The IR spectrum of the poly-o-hydroxyamide clearly shows only amide bands (at 1654 $cm^{-1}$ and 1539 $cm^{-1}$), but no ester band. Elemental analysis of the polymer yields the theoretical values, i.e., 58.37% carbon, 3.69% hydrogen, and 4.75% nitrogen; no sulfur can be detected.

The poly-o-hydroxyamide is clearly soluble in a commercial aqueous alkaline developer free of metal ions (NSD-TD, Tokyo Ohka) (0.5 g in 10 ml). For the preparation of films, 2.5 g of the poly-o-hydroxyamide is dissolved in 7.5 g of N-methylpyrrolidone and the solution formed is then filtered through a 1-micron filter and applied to a silicon wafer by means of centrifugation technology. After drying on a hot plate at 115° C., a uniform, defect-free polymer film is obtained on the wafer, with a layer thickness of 1400 nm.

Example 2 (Comparison Test)

A solution of 4.81 g of a dianhydride of isophthalic acid and p-toluenesulfonic acid (10.1 mmol) in 150 ml of tetrahydrofuran is added dropwise to a solution of 4.64 g of 2,2-bis(3-amino-4-hydroxyphenyl)hexafluoropropane (12.7 mmol) and 1.63 g of pyridine (20.6 mmol) in 50 ml of tetrahydrofuran at 20° to 25° C. and the reaction solution is stirred for 4 hours at 20° to 25° C. A capping of the end groups is then carried out as in Example 1 and the reaction solution is then worked up in a corresponding manner.

The IR spectrum of the polymer obtained by this process, in addition to the amide bands, shows a distinct ester band (at 1751 cm$^{-1}$). In the preparation of polymer films according to Example 1, it is found that these are defective and thus useless. In addition, already 0.2 g of the polymer is incompletely soluble in 10 ml of the developer.

As will be apparent to those skilled in the art, the present invention may be embodied in other forms or carried out in other ways without departing from the spirit or essential characteristics of the invention.

What is claimed is:

1. A process for preparing of poly-o-hydroxyamides and poly-o-mercaptoamides, comprising reacting a compound from the group consisting of bis-o-aminophenols and bis-o-amino-thiophenols at a temperature of ≦0° C. with a mixed dianhydride of a dicarboxylic acid and a sulfonic acid of the following structure:

E—SO$_2$—O—CO—R*—CO—O—SO$_2$—E in which:

E = CH$_3$, CF$_3$, R$^1$ 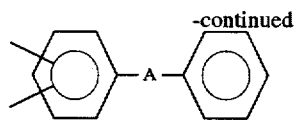

or R$^1$ 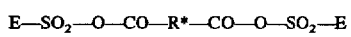

with R$^1$=H, F, CH$_3$ or CF$_3$;

R* has the following meaning:

(CR$_2$)$_m$, with R=H, F, CH$_3$, or CF$_3$ and m=1 to 10;

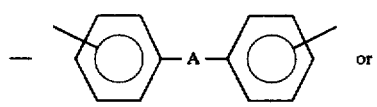 or

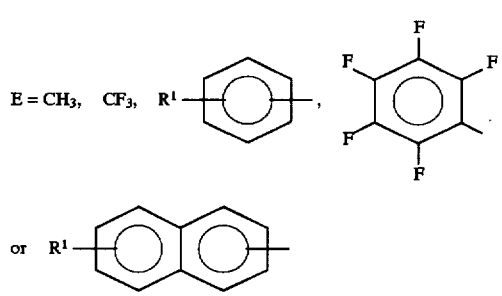

with A=(CH$_2$)$_n$, (CF$_2$)$_p$, C(CH$_3$)$_2$, C(CF$_3$)$_2$, C(CH$_3$) (C$_6$H$_5$), C(CF$_3$) (C$_6$H$_5$),

C(CF$_3$) (C$_6$F$_5$), C(C$_6$H$_5$)$_2$, CF$_2$—CF(CF$_3$), CH=CH, CF=CF,

C≡C, O—C$_6$H$_4$—O,

O, S, CO, or SO$_2$, where n=0 to 10 and p=1 to 10;

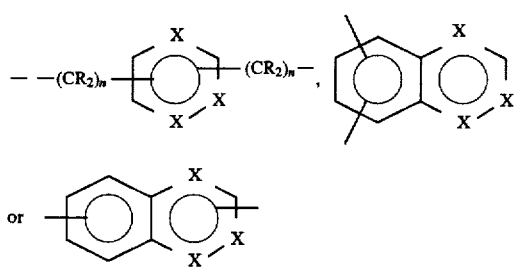

with X=CH or N,
R=H, F, CH$_3$, or CF$_3$,
and n=0 to 10;

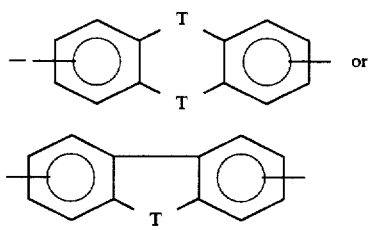

with T=CH$_2$, CF$_2$, CO, O, S, NH, or N(CH$_3$);

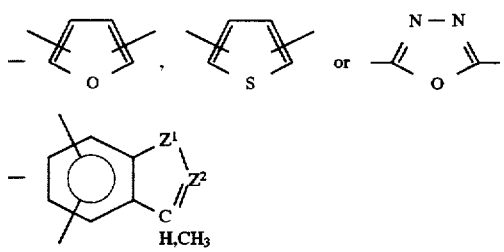

with Z$^1$=CH$_2$ or CH (CH$_3$) and Z$^2$=CH or C (CH$_3$)
Z$^1$=CH$_2$ or CH (CH$_3$) and Z$^2$=N
Z$^1$=NH or N (CH$_3$) and Z$^2$=CH or C (CH$_3$)
Z$^1$=NH or N (CH$_3$) and Z$^2$=N
with Z$^3$=CH, C(CH$_3$), or N

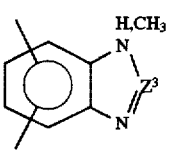

-continued

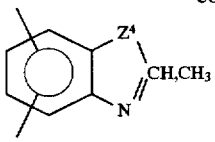

with $Z^4$=O or S;

where, in each case, all hydrogen atoms (H) in all aromatic partial structures can be replaced by fluorine (F).

2. The process of claim 1, wherein the mixed dianhydride is a dianhydride of isophthalic acid and p-toluenesulfonic acid.

3. The process of claim 1, wherein the reaction is carried out in the presence of a basic catalyst.

4. The process of claim 3, wherein the catalyst is a tertiary amine.

5. The process of claim 3, wherein the catalyst is used in an amount of at least 400 mol A, based on the dianhydride.

6. The process of claim 1, wherein the reaction is carried out at a temperature of $\leq -5°$ C.

* * * * *